(12) United States Patent
Krivts (Krayvitz) et al.

(10) Patent No.: US 11,177,048 B2
(45) Date of Patent: Nov. 16, 2021

(54) METHOD AND SYSTEM FOR EVALUATING OBJECTS

(71) Applicant: APPLIED MATERIALS ISRAEL LTD., Rehovot (IL)

(72) Inventors: Igor Krivts (Krayvitz), Rehovot (IL); Efim Vinnitsky, Ashkelon (IL); Yoram Uziel, Misgav (IL); Benzion Sender, Modiin-Macabim-Reut (IL); Ron Naftali, Shoham (IL)

(73) Assignee: APPLIED MATERIALS ISRAEL LTD., Rehovot (IL)

(*) Notice: Subject to any disclaimer, the term of this patent is extended or adjusted under 35 U.S.C. 154(b) by 148 days.

(21) Appl. No.: 16/689,567

(22) Filed: Nov. 20, 2019

(65) Prior Publication Data

US 2021/0151214 A1 May 20, 2021

(51) Int. Cl.
| | |
|---|---|
| *G21K 1/087* | (2006.01) |
| *G06K 9/32* | (2006.01) |
| *G06K 9/00* | (2006.01) |
| *G21K 1/10* | (2006.01) |

(52) U.S. Cl.
CPC ......... *G21K 1/087* (2013.01); *G06K 9/00201* (2013.01); *G06K 9/3233* (2013.01); *G21K 1/10* (2013.01)

(58) Field of Classification Search
CPC ........ G21K 1/087; G21K 1/10; G06K 9/3233; G06K 9/00201
See application file for complete search history.

(56) References Cited

U.S. PATENT DOCUMENTS

| | | | | | |
|---|---|---|---|---|---|
| 6,466,835 | B1* | 10/2002 | Ishizawa | ........... | H01L 21/67167 700/112 |
| 6,899,765 | B2* | 5/2005 | Krivts | ............... | H01L 21/67126 118/719 |
| 7,109,486 | B1* | 9/2006 | Spallas | .................... | H01J 37/04 250/306 |
| 7,332,729 | B1* | 2/2008 | Muray | .................... | B82Y 10/00 250/491.1 |
| 8,033,771 | B1* | 10/2011 | Gage | ................. | H01L 21/67201 414/217 |
| 10,049,904 | B1* | 8/2018 | Adan | ................. | H01L 21/67126 |
| 2002/0005168 | A1* | 1/2002 | Kraus | ............... | H01L 21/67196 118/715 |
| 2003/0113187 | A1* | 6/2003 | Lei | .................... | H01L 21/67745 414/217 |
| 2005/0031187 | A1* | 2/2005 | Lin | .................... | H01L 21/67253 382/145 |

(Continued)

*Primary Examiner* — David A Vanore
(74) *Attorney, Agent, or Firm* — Kilpatrick Townsend & Stockton LLP

(57) ABSTRACT

A method and a system. The system may include (a) evaluation units, (b) an object distribution system for receiving the objects and distributing the objects between the evaluation units, and (c) at least one controller. Each evaluation unit may include (i) a chamber housing that has an inner space, (ii) a chuck, (iii) a movement system that is configured to move the chuck, and (iv) a charged particle module that is configured to irradiate the object with a charged particle beam, and to detect particles emitted from the object. In each evaluation unit a length of the inner space is smaller than twice a length of the object, and a width of the inner space is smaller than twice a width of the object.

11 Claims, 18 Drawing Sheets

(56) References Cited

U.S. PATENT DOCUMENTS

| | | | |
|---|---|---|---|
| 2005/0218337 A1* | 10/2005 | Kai | H01L 21/67167 250/441.11 |
| 2006/0245852 A1* | 11/2006 | Iwabuchi | H01L 21/67201 414/217 |
| 2007/0107845 A1* | 5/2007 | Ishizawa | H01L 21/67115 156/345.32 |
| 2009/0277472 A1* | 11/2009 | Rivkin | H01L 21/68771 134/1.3 |
| 2014/0027968 A1* | 1/2014 | Krayvitz (Krivts) | H01L 21/67201 269/287 |
| 2014/0077078 A1* | 3/2014 | Hatakeyama | H01J 37/075 250/310 |
| 2014/0312227 A1* | 10/2014 | Yoshikawa | H01J 37/285 250/310 |
| 2015/0287570 A1* | 10/2015 | Hayashi | H01J 37/185 250/310 |
| 2016/0268097 A1* | 9/2016 | Rice | H01J 37/20 |
| 2021/0026123 A1* | 1/2021 | Krivts (Krayvitz) | G02B 21/26 |
| 2021/0151214 A1* | 5/2021 | Krivts (Krayvitz) | G21K 1/087 |

\* cited by examiner

US 11,177,048 B2

METHOD AND SYSTEM FOR EVALUATING OBJECTS

BACKGROUND OF THE INVENTION

Objects such as wafers are manufactured by a highly complex manufacturing process.

The wafer may be evaluated during the manufacturing process and even after the completion of the manufacturing process.

The evaluation of the integrated circuit may include inspecting the integrated circuit, reviewing the wafer and/or measuring structural elements of the integrated circuit.

Scanning electron microscopes exhibit a nanometric resolution but are slow and have relatively large footprints.

There is a growing need to provide fast and compact systems and method for evaluating objects such as integrated circuits.

BRIEF SUMMARY OF THE INVENTION

There may be provided a system. The system may include (a) evaluation units, (b) an object distribution system for receiving the objects and distributing the objects between the evaluation units, and (c) at least one controller. Each evaluation unit may include (i) a chamber housing that has an inner space, (ii) a chuck, (iii) a movement system that is conFigured to move the chuck, and (iv) a charged particle module that is conFigured to irradiate the object with a charged particle beam, and to detect particles emitted from the object. In each evaluation unit, a length of the inner space is smaller than twice a length of the object, and a width of the inner space is smaller than twice a width of the object.

There may be provided a method. The method may include (a) receiving objects by an object distribution system, (b) distributing the objects, by the object distribution system, between evaluation units, and (c) evaluating the objects by the evaluation units. The evaluating of the objects by the evaluation units may include evaluating at least two objects by at least two evaluation units in parallel. The evaluating of an object of the objects by an evaluation unit of the evaluation units may include (i) positioning the object on a chuck of the evaluation unit and within an inner space that is defined by a chamber housing of the evaluation unit, (ii) sealing the inner space from a movement system of the evaluation unit, (iii) irradiating, by a charged particle module of the evaluation unit, the object with a charged particle beam, and (iv) detecting, by the charged particle module, particles emitted from the object. For each evaluation unit of the evaluation units, a length of the inner space is smaller than twice a length of the object and a width of the inner space is smaller than twice a width of the object.

BRIEF DESCRIPTION OF THE DRAWINGS

The subject matter regarded as the embodiments of the disclosure is particularly pointed out and distinctly claimed in the concluding portion of the specification. The embodiments of the disclosure, however, both as to organization and method of step, together with objects, features, and advantages thereof, may best be understood by reference to the following detailed description when read with the accompanying drawings in which:

FIG. 8 is an example of a system;

Figure 1:
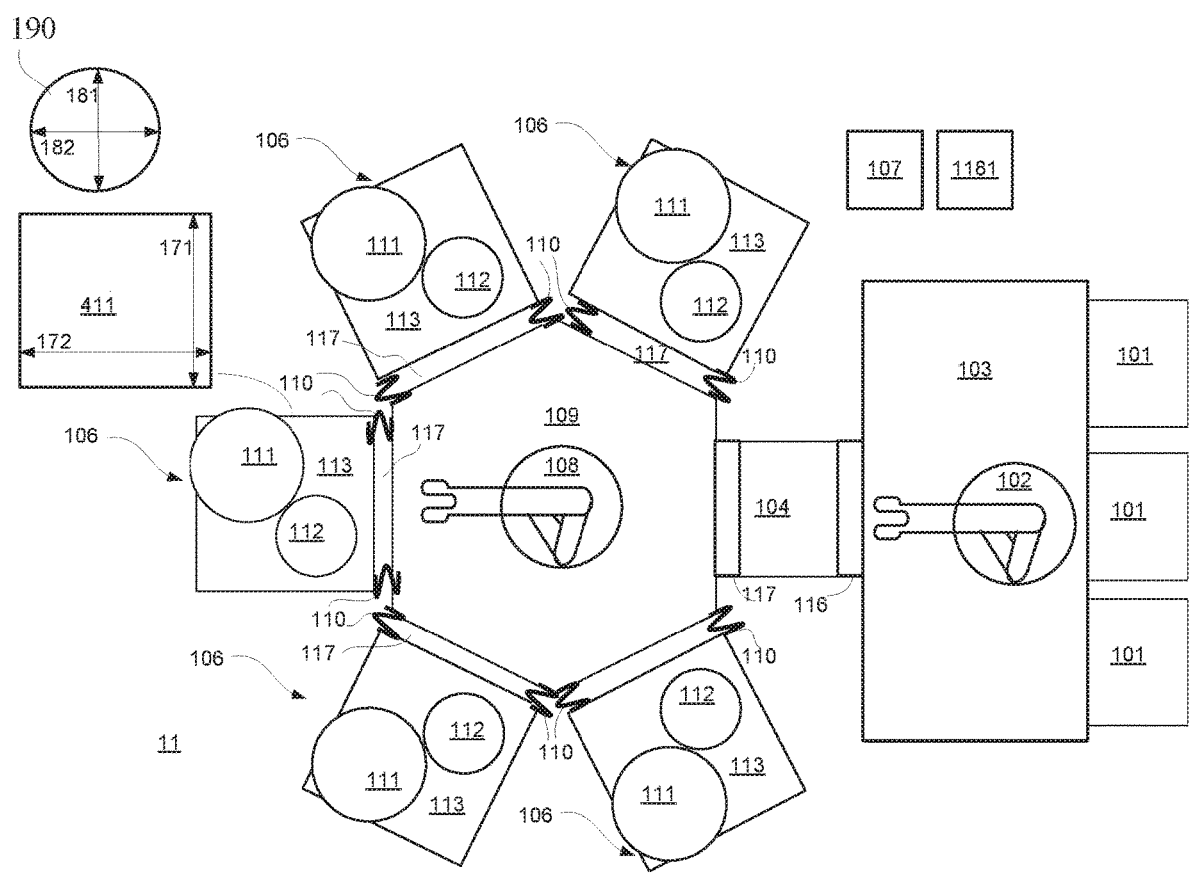
FIG. 1 is an example of a system.

It will be appreciated that for simplicity and clarity of illustration, elements shown in the Figures have not necessarily been drawn to scale. For example, the dimensions of some of the elements may be exaggerated relative to other elements for clarity. Further, where considered appropriate, reference numerals may be repeated among the Figures to indicate corresponding or analogous elements.

DETAILED DESCRIPTION OF THE INVENTION

In the following detailed description, numerous specific details are set forth in order to provide a thorough understanding of the embodiments of the disclosure. However, it will be understood by those skilled in the art that the present embodiments of the disclosure may be practiced without these specific details. In other instances, well-known methods, procedures, and components have not been described in detail so as not to obscure the present embodiments of the disclosure.

Any reference in the specification to a method should be applied mutatis mutandis to a system capable of executing the method.

Any reference in the specification to a system should be applied mutatis mutandis to a method that may be executed by the system.

The assignment of the same reference numbers to various components may indicate that these components are similar to each other.

FIG. 1 illustrates an example of system 11 for evaluation of objects. FIG. 1 also illustrates object 190.

System 11 includes five evaluation units 106, an object distribution system, at least one controller 107 and processor 1181.

The number of evaluation units per system may be two, three, four or may exceed five.

The evaluation units 106 may work independently from each other. In order to increase throughput, at least two evaluation units 106 operate in parallel to each other. Parallel means in an overlapping or in a partial overlapping manner.

The object distribution system is configured to receive objects and distribute the objects between evaluation units 106.

The object distribution system may receive at least one object at a time. The object distribution system may distribute at least one object at a time.

In FIG. 1 the object distribution system is illustrated as including factory interface unit 103, outside transfer robot 102, load lock 104, transfer chamber 109 and inside transfer robot 108.

The outside transfer robot 102 may be located inside factory interface unit 103. Inside transfer robot 108 may be located within transfer chamber 109.

In system 11 objects such as wafers may be transported in a cassette 101.

The cassette 101 is loaded on load ports of the factory interface unit 103. The factory interface unit 103 is an interface that is configured to receive objects.

The outside transfer robot 102 transfers the objects from the cassette 101 to load lock 104.

One or more vacuum pumps (not shown) connected to the load lock 104 may pump down the load lock 104 to a desired pressure level that may approximate the pressure level in transfer chamber 109.

An external gate 116 of the load lock and internal gate 117 between the load lock 104 and the transfer chamber 109 as well as vacuum pumps and venting system (not shown) provide necessary vent/pump cycle of the load lock 104. The load lock 104 may include a support module 1041 for receiving and supporting an object.

Inside transfer robot 108 picks up an object from the load lock 104 and loads the object into any of the evaluation units 106.

The object may be transferred from the load lock 104 to any evaluation unit 106, and from one evaluation unit 106 to another evaluation unit 106 under a controlled pressure level, including various levels of vacuum.

The pressure levels within the load lock 104, the transfer chamber 109, and each of the evaluation units 106 may be maintained at substantially the same or different pressure levels, as desired.

Internal gates 117 may be mounted between transfer chamber 109 and the evaluation units 106. The internal gates 117 provide prevention of the objects cross-contamination.

In FIG. 1, each evaluation unit includes a charged particle module such as a scanning electron microscope column 111, optical microscope 112 and chamber 113. The optical microscope 112 may be used for detecting suspected defects, navigating towards suspected defects and the like.

Each evaluation unit 106 is compact in the sense that (a) a width 171 of space 411 which is an inner space defined by the chamber 113 does not exceed twice a width 181 of object 190, and (b) a length 172 of space 411 defined by the chamber 113 does not exceed twice a length 182 of object 190.

The evaluation unit 106 may be compact by evaluating only one region of the object 190 at a time. The object 190 is moved between an evaluation of one region to the other—in order to expose different regions of the object to the scanning electron microscope at a time.

FIG. 1 also illustrates vibration dumping elements such as bellows 110 that are coupled between the evaluation units 106 and the transfer chamber 109 of the object distribution system.

The evaluation of an object by an evaluation unit may involve moving the object. A movement of the object by one evaluation unit may vibrate another evaluation unit. Vibration dumpling elements may be any mechanical elements that dump (attenuate) the vibration generated by one evaluation unit. Especially—attenuate the vibrations before the vibrations reach another evaluation unit.

FIG. 1 further illustrates one or more processors such as processor 1181. The one or more processors may be con-Figured to process images or any other detection signals received from the evaluation units. The one or more processors may be any combination of hardware processors, image processors, accelerators, general-purpose computers, and the like. The one or more processors may be included in the evaluation units 106, located outside the evaluation units 106, and the like.

Figure 2:
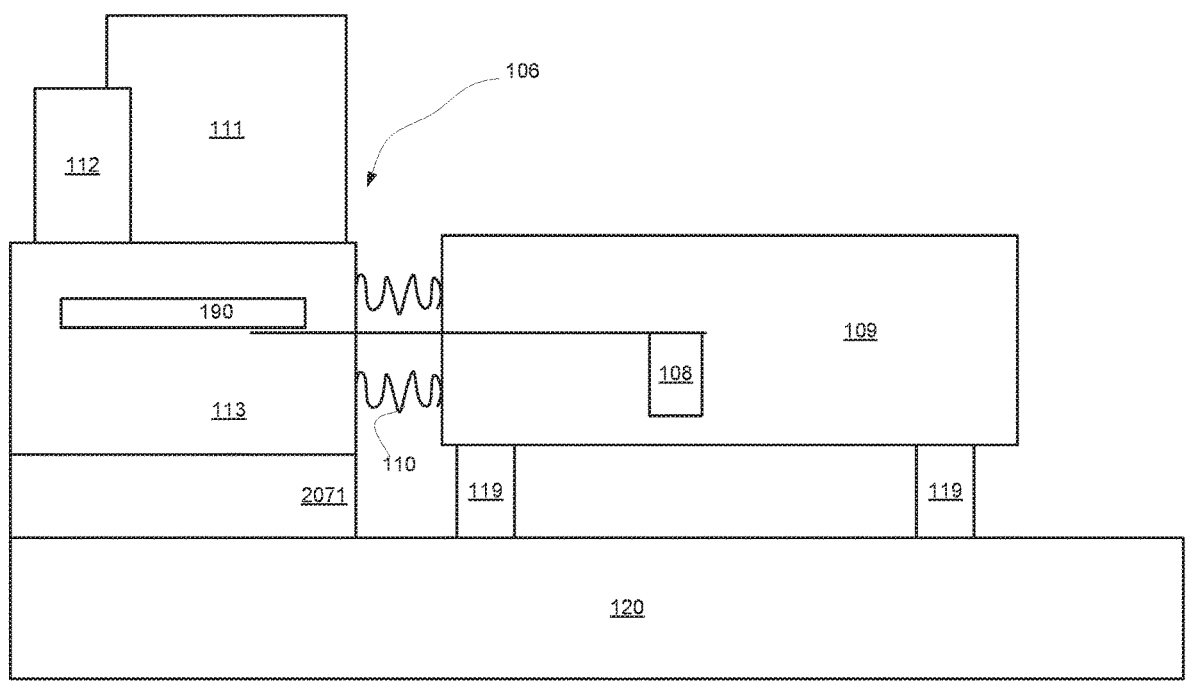
FIG. 2 is an example of a cross-sectional view of a system.

FIG. 2 is a cross-sectional view of a part of system 11. FIG. 2 also illustrates object 190.

System 11 is shown as including:
a. Transfer chamber 109.
b. Inside transfer robot 108.
c. Evaluation unit 106 that includes chamber 113, scanning electron microscope column 111, optical microscope 112 and first vibration isolation system 2071.
d. Legs 119.
e. Base 120.
f. Bellows 110.

Transfer chamber 109 is supported by legs 119.

Chamber 113 is supported by a first vibration isolation system 2071.

Legs 119 and first vibration isolation system 2071 are positioned on base 120.

Base 120 may be a part of a chassis.

Figure 3:
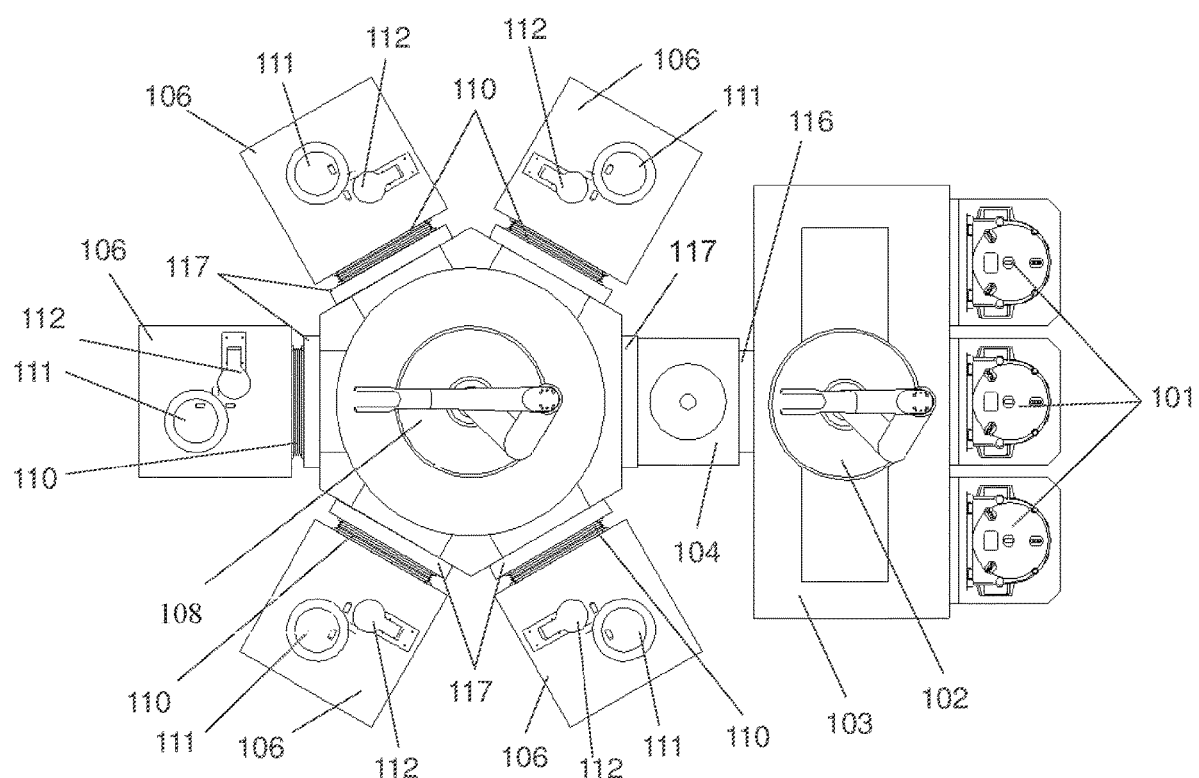
FIG. 3 is an example of a system.

FIG. 3 illustrates an example of system 19 for evaluation of objects.

System 19 includes five evaluation units 106, an object distribution system, at least one controller (not shown) and at least one processor (not shown).

FIG. 3 differs from FIG. 1 by providing a more detailed example of bellows 110.

Figure 4:
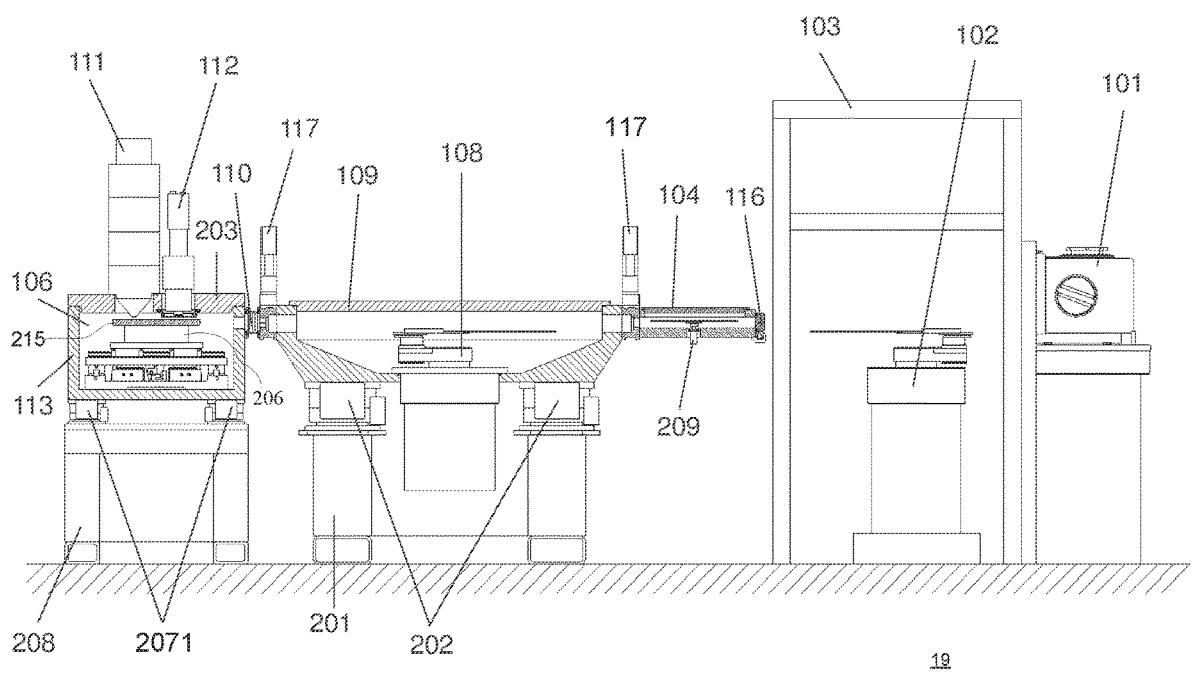
FIG. 4 is an example of a cross-sectional view of a system.

FIG. 4 is a cross-sectional view of a part of system 19.
System 19 is shown as including:
a. Cassette 101.
b. Factory interface unit 103.
c. Outside transfer robot 102.
d. Load lock 104. Load lock 104 has an external gate 116.
e. Inside transfer robot 108.
f. Transfer chamber 109.
g. Bellows 110.
h. Internal gates 117 between the transfer chamber and each one of the load lock 104 and the evaluation units 106.
i. Pre-liner module 209.
j. Second chassis 201.
k. Second vibration isolation system 202.
l. Transfer chamber 109. Transfer chamber 109 is mounted on the second vibration isolation system 202. Second vibration isolation system 202 is installed on the second chassis 201.
m. Evaluation unit 106. Evaluation unit 106 includes a chamber 113 that includes a cover 203 and a sidewall. Evaluation unit 106 also includes a chuck (electrostatic or mechanical) 215, and movement system (for example, XY stage, XYZ stage, XYZ$\ominus$ stage, $\ominus$ stage or R$\ominus$Z stage) 206.
n. Scanning electron microscope column 111.
o. Optical microscope 112 that is installed on the cover 203.
P. First chassis 208.
q. First vibration isolation system 2071 that is installed on first chassis 208.

Chamber 113 may be compact design because, for example, the 300 mm wafer is positioned on top of a substrate motion system. The movement system is configured to move along each one of X-axis and Y axis is by up to 75 mm per direction.

A quarter turn of the substrate may be done by a rotary stage (⊖ stage) of movement system 206, or by the pre-liner module 209 that may be mounted, for example, in the load lock 104.

Figure 5:
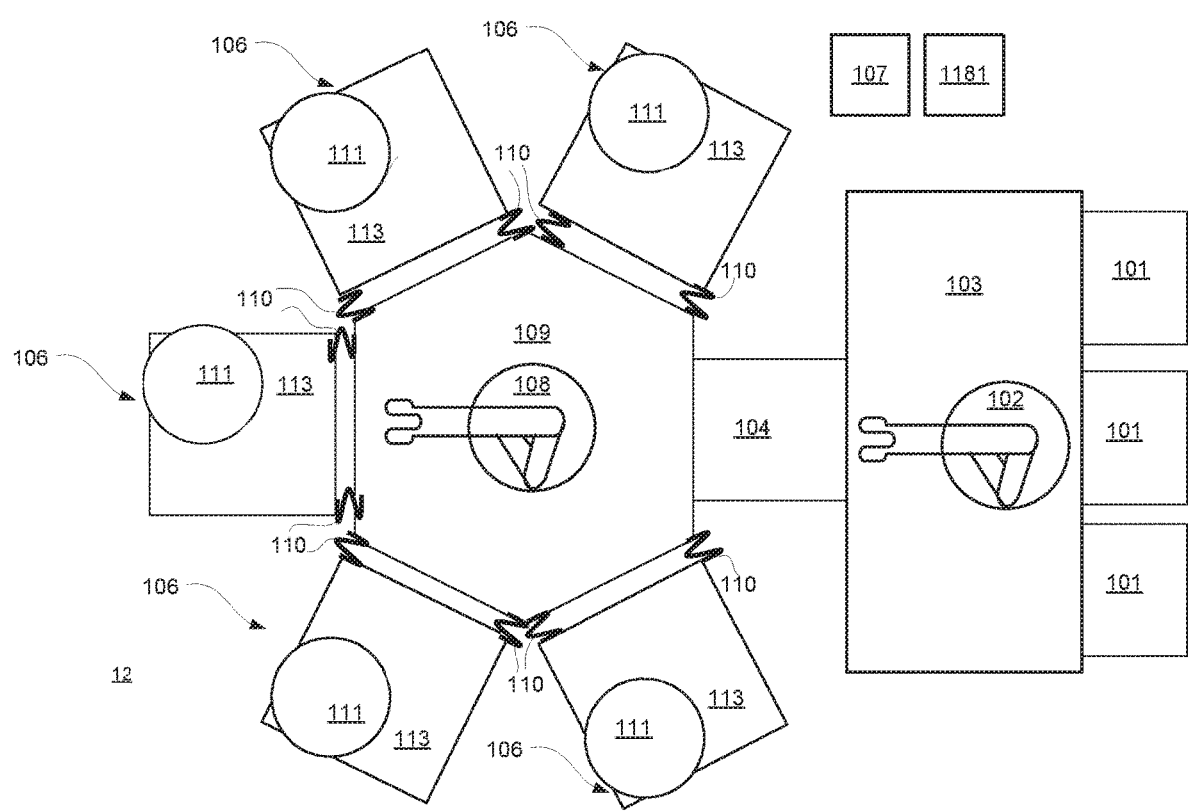
FIG. 5 is an example of a system.

FIG. 5 illustrates an example of system 12 for evaluation of objects.

System 12 differs from system 11 of FIG. 1 by having evaluation units 106 that do not include optical microscopes.

Figure 6:
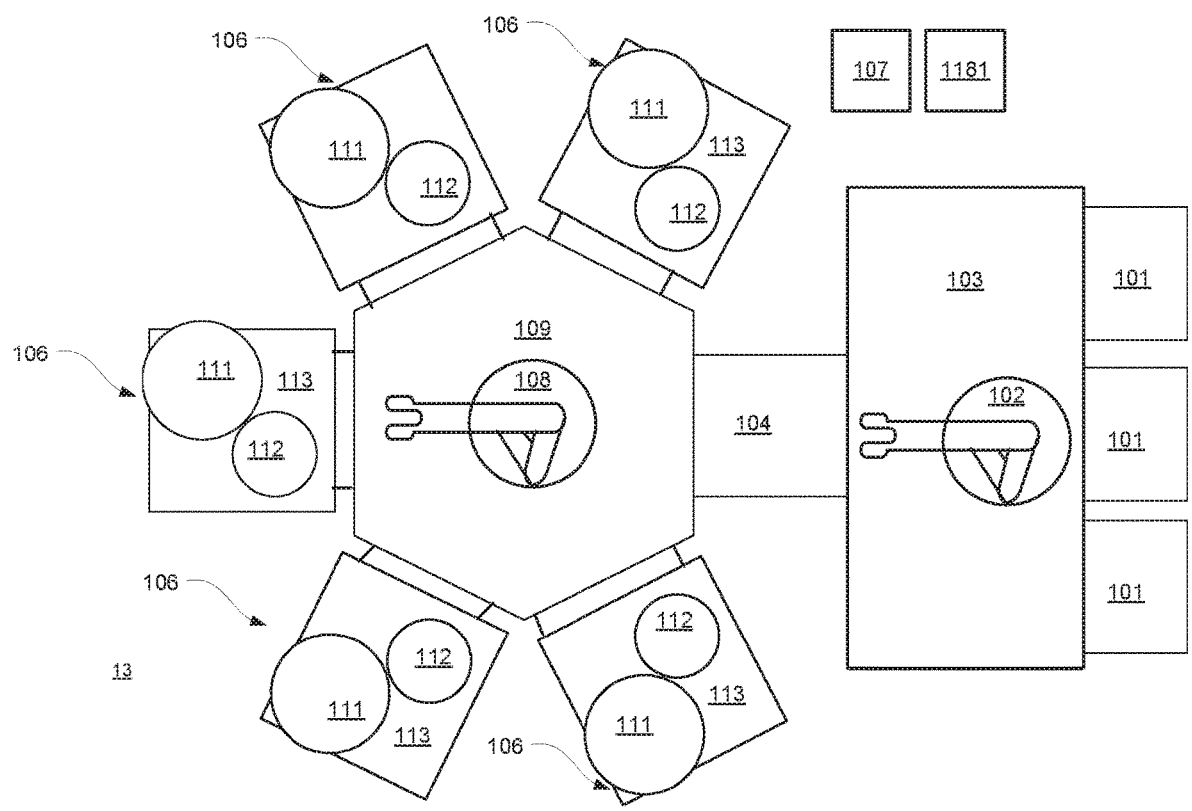
FIG. 6 is an example of a system.

FIG. 6 illustrates an example of system 13 for evaluation of objects.

System 13 differs from system 11 of FIG. 1 by not including bellows 110.

Figure 7:
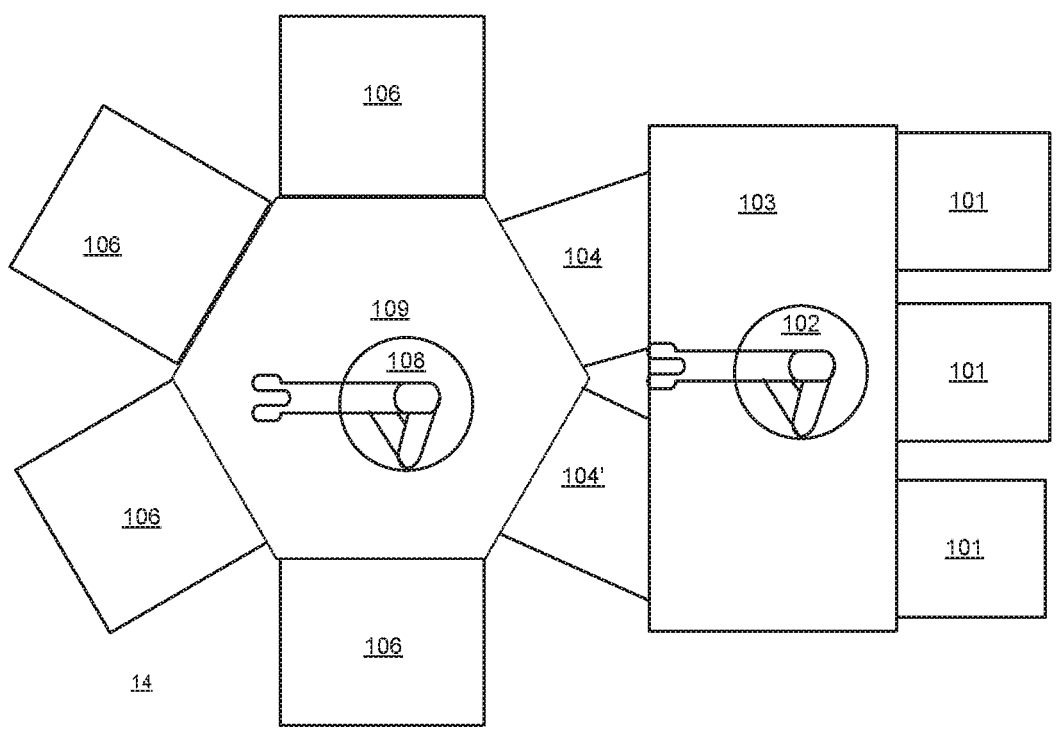
FIG. 7 is an example of a system.
Figure 6:
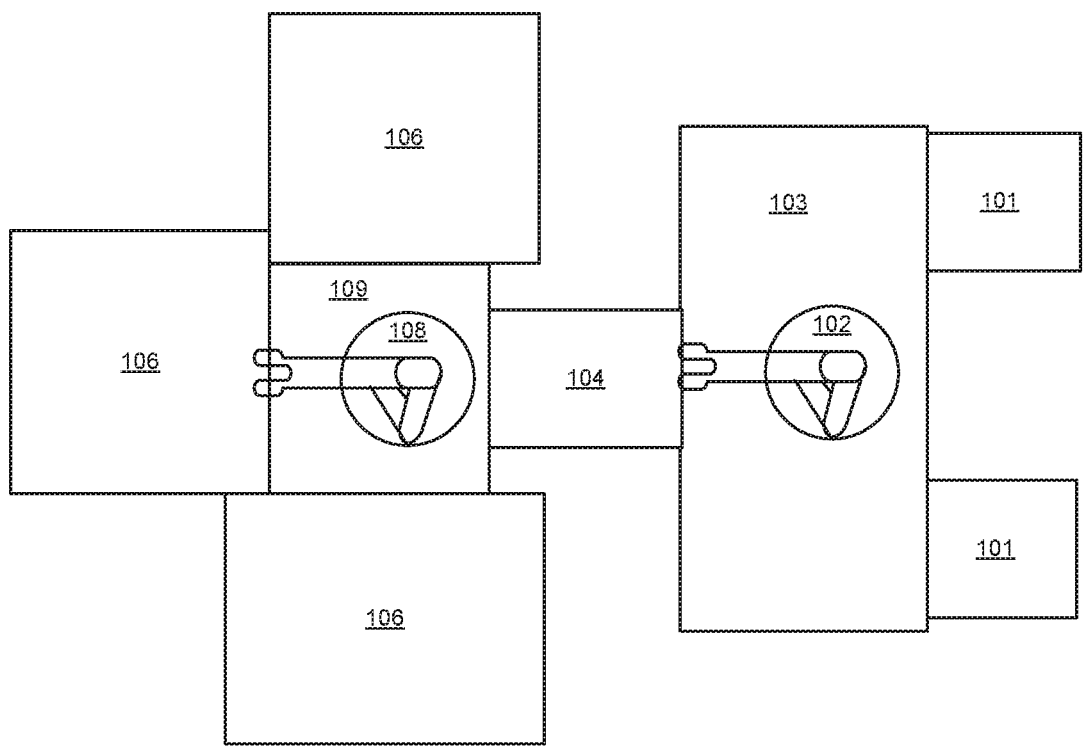

FIG. 7 illustrates an example of system 14 for evaluation of objects.

System 14 differs from system 11 of FIG. 1 by:
a. Having four evaluation units 106 and not five evaluation units 106.
b. Having an additional load lock 104'. Load lock 104 and additional load lock 104' are connected between factory interface unit 103 and transfer chamber 109.

Using multiple load locks may increase the rate of exchanging objects between factory interface unit 103 and transfer chamber 109.

FIG. 8 illustrates an example of system 15 for evaluation of objects.

System 15 differs from system 11 of FIG. 1 by:
a. Having three evaluation units 106 and not five evaluation units 106.
b. Having two cassettes 101 instead of three cassettes.

Figure 9:
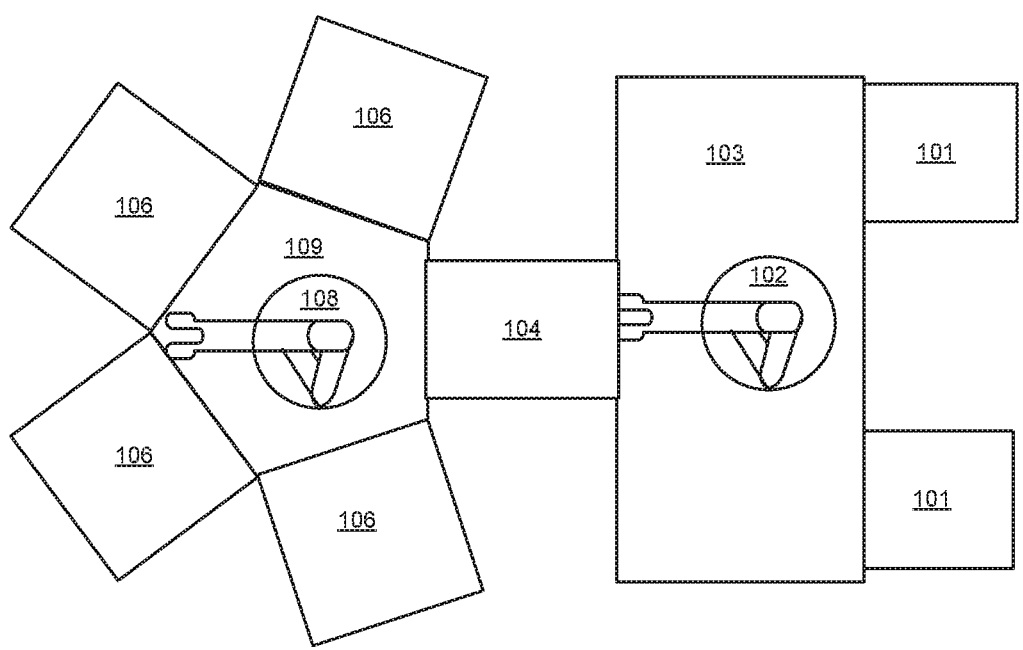
FIG. 9 is an example of a system.

FIG. 9 illustrates an example of system 16 for evaluation of objects.

System 16 differs from system 11 of FIG. 1 by having four evaluation units 106 and not five evaluation units 106.

Any combination of any components of any system illustrated in any of the Figures may be provided. The number of each component is each of the system may differ from those illustrated in any of the Figures. For example the number of load locks per system may exceed one.

Figure 10:
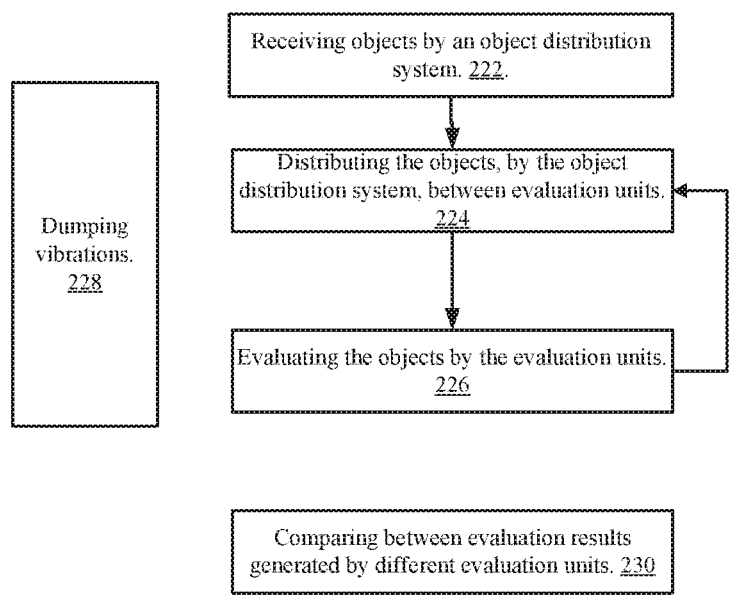
FIG. 10 is an example of a method.

FIG. 10 illustrates an example of method 220.

Method 220 may include the following steps:
a. Receiving (222) objects by an object distribution system. The objects may be received simultaneously, one at a time or some at a time. For example, objects may be received from one or more cassettes, housings and the like. The receiving may include receiving one or more objects by one or more outside transfer robots, and transferring the object via one or more load lock and to the inner transfer robot.
b. Distributing (224) the objects, by the object distribution system, between evaluation units. The distributing may include providing one or more objected by one or more inner transfer robot to one or more evaluation units, transfecting an object from one evaluation unit to another.
c. Evaluating (226) the objects by the evaluation units. The evaluating may include at least one out of inspecting, reviewing or performing a metrology operation.
d. Dumping (228) dumping vibrations. Especially, dumping vibrations by vibration dumping elements that are coupled between the evaluation units and the object distribution system.

The receiving (222), distributing (224) and the evaluation (226) may be executed in a sequential manner, in a pipelined manner, in an overlapping manner, in a non-overlapping manner, in a partially overlapping manner and the like. For example, two substrates may be fed to two evaluation units while a third evaluation unit is being fed by a third substrate.

The dumping can be executed in parallel to the evaluating.

For each evaluation unit of the evaluation units, the length of the inner space may be smaller than twice the length of the object. The length of the inner space may be measured within an imaginary plane in which the object is positioned during the evaluation of the object. The imaginary plane may be positioned slightly above the chuck.

For each evaluation unit of the evaluation units, the width of the inner space may be smaller than twice the width of the object. The width of the inner space may be measured within the imaginary plane in which the object is positioned during the evaluation of the object.

For each evaluation unit of the evaluation units, the length of the inner space may be smaller than twice the length of the object but may exceed 1.5 times of the length of the object.

For each evaluation unit of the evaluation units, the width of the inner space may be smaller than twice the width of the object but may exceed 1.5 times of the width of the object.

Figure 16:
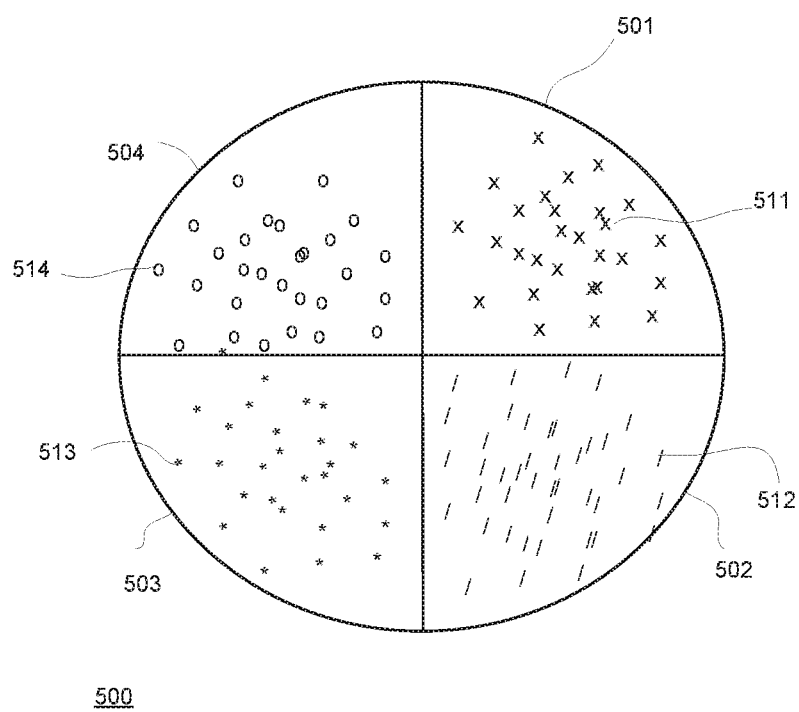
FIG. 16 is an example of an object.

The evaluating (226) may include executing one or more steps of method 900 of FIG. 16.

The evaluating (226) may include repeating, for each region of the object out of a plurality of regions of the object:
a. Rotating the chuck, by the movement system, to position a given portion of the region of the object within a field of view of the charged particle module; and
b. Moving the chuck, by the movement system, in relation to the charged particle module to position additional portions of the region of the object within the field of view of the charged particle module.

The object can have a radial symmetry, and the plurality of regions may include four regions.

Method 220 may include comparing (230) between evaluation results generated by different evaluation units. The evaluation results may refer to the same object or to different objects. The comparing may be used for various purposes including defect detection, calibration of stations, evaluating process variations and the like.

Figure 11:
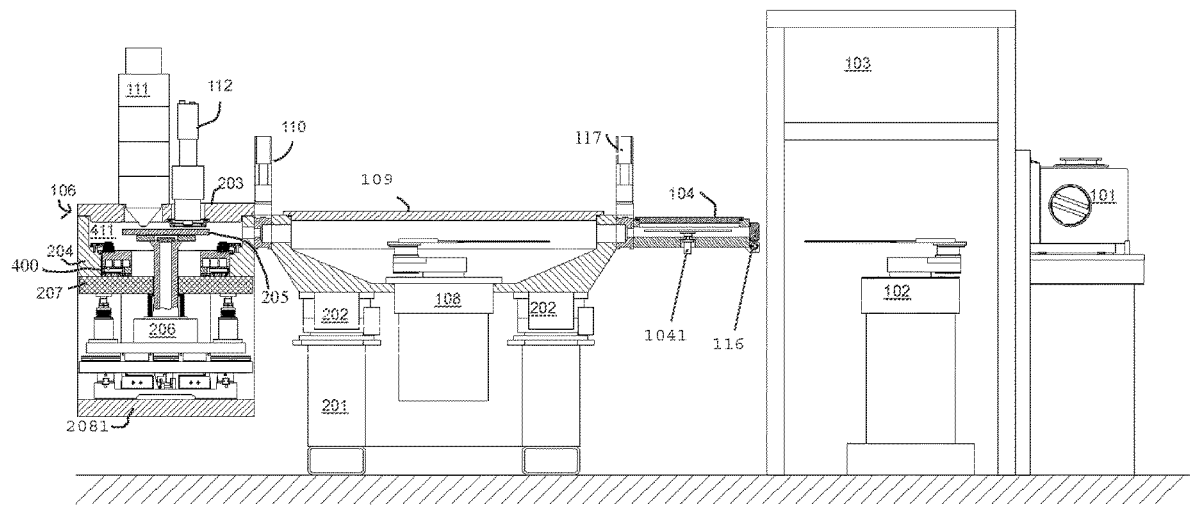
FIG. 11 is an example of a cross-sectional view of a system.

FIG. 11 is an example of a cross-sectional view of system 11. The cross-section is taken along an imaginary plane that does not cross the center of system 11.

FIG. 11 illustrates:
a. Cassette 101.
b. Outside transfer robot 102.
c. Factory interface unit 103.
d. Load lock 140. Load lock 104 includes external gate 116, internal gate 117, and support module 1041 for receiving and supporting an object.
e. Second vibration isolation system 202, which is installed on the second chassis 201. The second vibration isolation system 202 supports the transfer chamber 109. Such configuration allows reaching a high-resolution image of the object features and improves the quality of treatment in process chambers.
f. Evaluation unit 106.
g. Inside transfer robot 108.
h. Transfer chamber 109.
i. Scanning electron microscope column 111.
j. Optical microscope 112.
k. A housing of the evaluation unit that includes cover 203 and sidewalls 204.

l. Chuck 205. Chuck 205 may be an electrostatic chuck or a mechanical chuck. Chuck 205 may support an object.
m. Movement system 206.
n. Sealing plate 207.
o. Module 400 which is an air bearing/differential pumping module.
p. Vacuumed space 411 that is defined by the housing of the evaluation unit and the sealing plate 207.
q. Movement system base 2081.

The movement system 206 includes a rotation stage (also referred to as theta stage) for rotating the object, a Z stage and may also include one stage such as an XY stage or a R stage.

Figure 12:
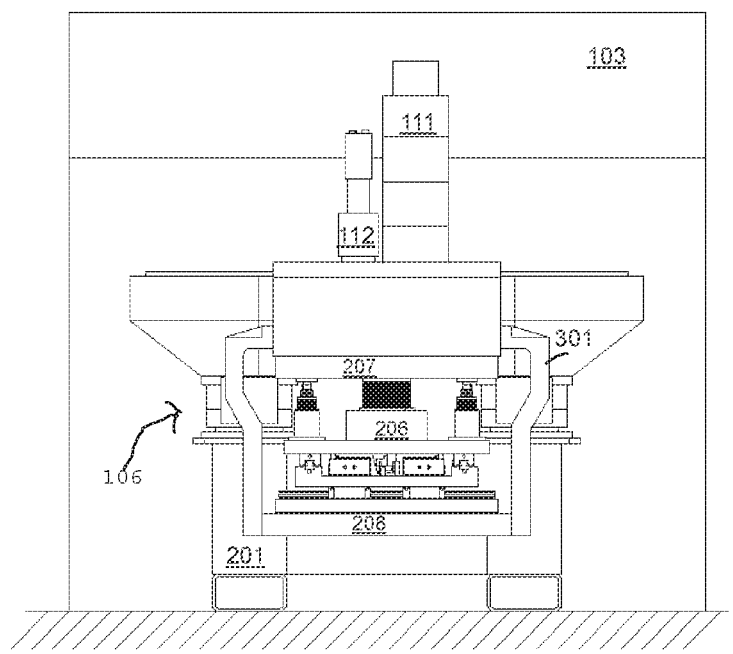
FIG. 12 is an example of a rear view of a system.

FIG. 12 is an example of a rear view of the evaluation unit 106. The movement system base 208 has brackets 301. The brackets 301 are connected to the sidewalls 204 of the evaluation unit 106. FIG. 12 also illustrates second chassis 201, sealing plate 207, movement system 206, and movement system base 2081.

The evaluation unit 106 prevents sources of contamination from contaminating an object.

The object, during evaluation processes or manufacturing processes, is located in a vacuumed space in which predetermined conditions (contamination level, vacuum level, temperature and the like) are maintained even when the object is moved by the movement system 206.

The movement system 206 may be located in atmosphere environment. Cables, control device and various other components can be located in atmosphere in order to reduce and even eliminate the amount of contaminating elements generated within the atmosphere. The chamber can be free of moving parts.

Figure 13:
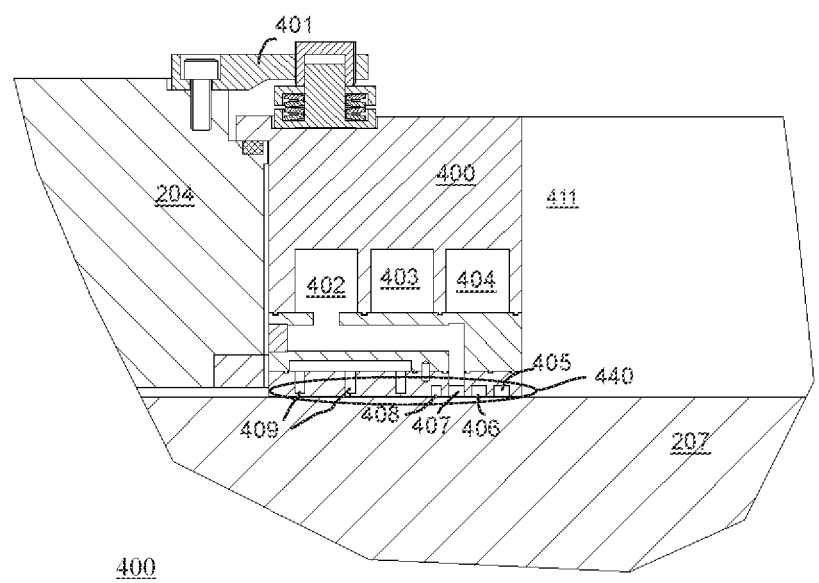
FIG. 13 is an example of a cross-sectional view of some evaluation units that illustrates a dynamic seal.
Figure 14:
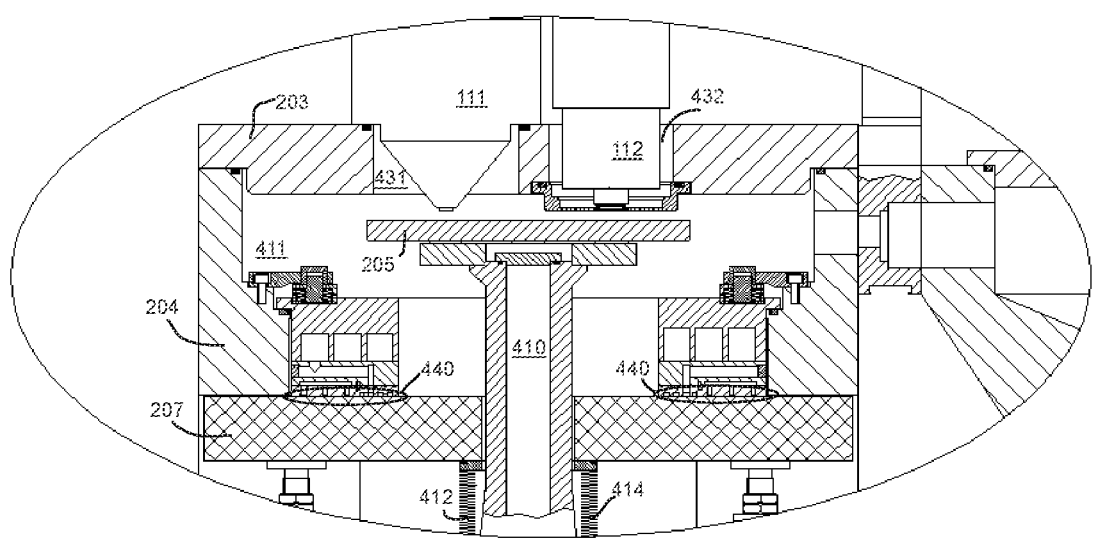
FIG. 14 is an example of a cross-sectional view of some evaluation units.

The vacuumed space can be isolated from atmosphere environment by using one or more dynamic seals, such as dynamic seals 440 of FIGS. 13 and 14.

Contamination which is generated by the movement system 206, by bearing and from plastic cables may be prevented from reaching the vacuumed space 411 due to a positive air flow formed by the dynamic seal. The dynamic seal can be arranged to generate an air flow directed towards the atmosphere and thus repel contamination from entering the vacuum chamber.

FIG. 13 is a cross-sectional view of the area of a module 400 that illustrates a dynamic seal 440.

The seal is dynamic in the sense that it requires to circulate air.

The module 400 is mechanically connected to sidewall 204 and forms a dynamic seal 440 between the bottom surface of module 400 and sealing plate 207.

The module 400 may include one or more sealing elements such as first vacuum conduit 402, second vacuum conduit 403 and third vacuum conduit 404, each of which is connected with its vacuum pump (not shown in the Figure).

The bottom surface of module 400 includes the three vacuum grooves 405, 406 and 407 and atmospheric pressure gas groove 408 which is a differential pumping unit. In addition, the bottom part of module 400 may include several orifices 409 which form an air bearing unit. The manner in which a gas cushion (dynamic seal) is formed is illustrated, for example, in U.S. Pat. No. 6,899,765 which is incorporated herein by reference in its entirety. Different conduits can provide gas at different pressure and/or vacuum levels.

Module 400 may be mechanically connected to sidewall 204 by a clamping mechanism 401. The clamping mechanism 401 is arranged around the perimeter of module 400 and are adapted to provide sufficient force to compensate for the force of the pressure differential between the module 400 and the atmosphere.

Figure 15:
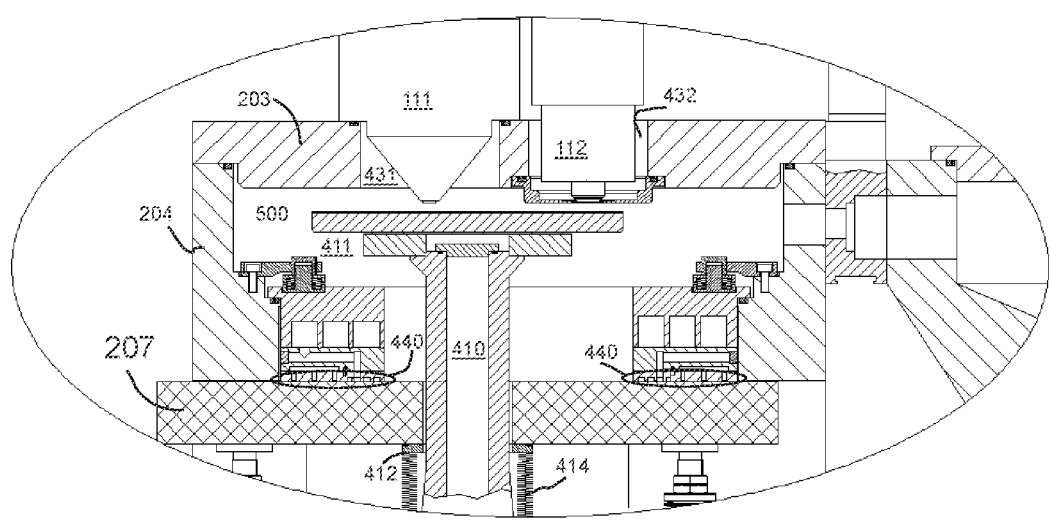
FIG. 15 is an example of a cross-sectional view of some evaluation units.

FIGS. 14 and 15 illustrate various parts of the system 11 such as cover 203, scanning electron microscope column 111, optical microscope 112, chuck 205, support element 410, sealing plate 207, first opening 431, second opening 432, first bellows 412 and second bellows 414.

Support element 410 supports chuck 205 and mechanically coupled chuck 205 to the movement system 206.

FIGS. 14 and 15 also illustrate dynamic seals 440.

First bellows 412 and second bellows 414 surround the support element 410 in order to prevent a leakage of particles from the movement system 206 into vacuumed space 411.

First opening 431 and second opening 432 are formed in cover 203. A lower part of scanning electron microscope column 111 is inserted through first opening 431. A lower part of optical microscope 112 is inserted through second opening 432.

The sealing plate 207 of FIG. 13 is positioned in a different position than the sealing plate 207 of FIG. 5, due to a movement of the sealing plate 207 (as well as the support element 410 and the chuck 205) by the movement system.

FIG. 16 illustrates an example of object 500, first region 501, second region 502, third region 503, fourth region 504, portions 511 of first region 501, portions 512 of second region 502, portions 513 of third region 503 and portions 514 of fourth region 504.

Object 500 has a symmetrical symmetry and first region 501, second region 502, third region 503, fourth region 504 have a quadrant shape.

The evaluation unit may evaluate object 500 by four iterations. A single region may be evaluated during each iteration of the four iterations. Each iteration may start by rotating the object 500 by ninety degrees in order to reach the region that should be evaluated during the iteration.

Reaching regions means that portions of the region can be positioned within the field of view of the scanning electron microscope and/or within the field of view of the optical microscope by moving the chuck.

The field of view of the scanning electron microscope may be smaller than the region but additional movements of the chuck (for example raster scan movement or any other movements) and/or scanning by at the scanning electron microscope may cover the entire region. The same applies to the optical microscope.

The movements of the chuck are limited to movements that should not cause another region of the object to be positioned within the field of view of the scanning electron microscope and/or within the field of view of the optical microscope.

During a first iteration, portions 511 of first region 501 may be positioned within the within the field of view of the scanning electron microscope and/or within the field of view of the optical microscope.

During a second iteration, portions 512 of second region 502 may be positioned within the within the field of view of the scanning electron microscope and/or within the field of view of the optical microscope.

During a third iteration, portions 513 of third region 503 may be positioned within the within the field of view of the scanning electron microscope and/or within the field of view of the optical microscope.

During a fourth iteration, portions 514 of fourth region 504 may be positioned within the within the field of view of the scanning electron microscope and/or within the field of view of the optical microscope.

Figure 17:
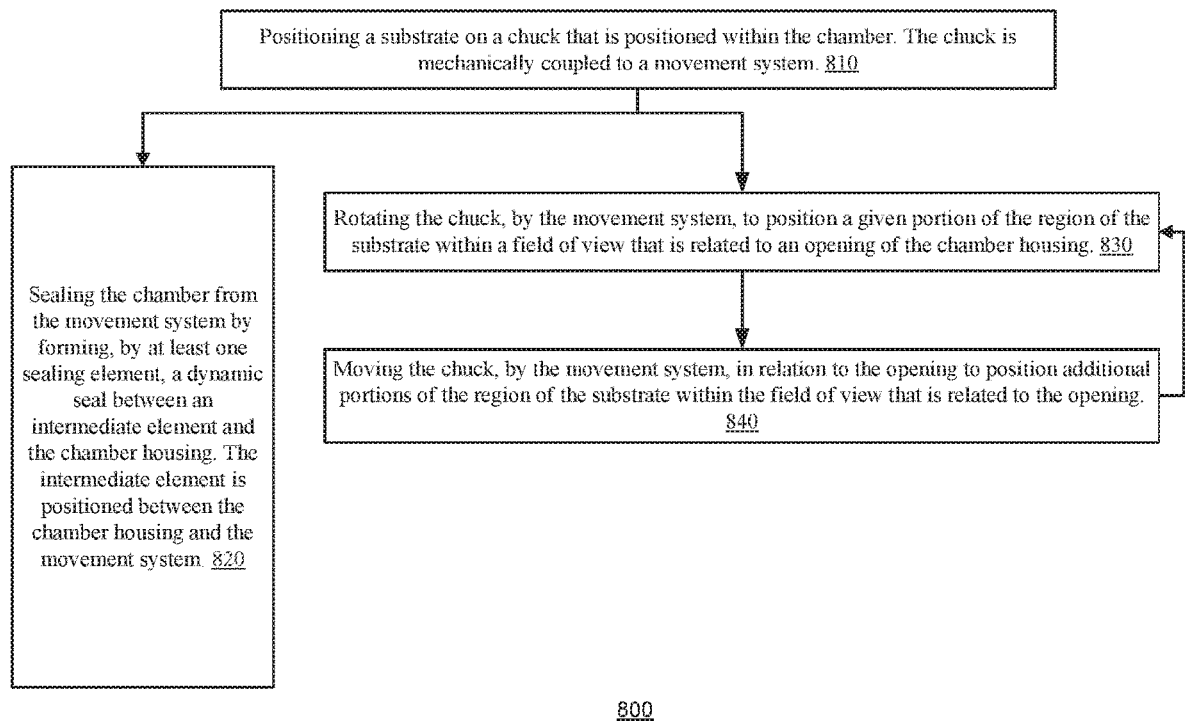
FIG. 17 is an example of a method.

FIG. 17 is an example of method 800 for moving an object within a chamber that includes a chamber housing.

Method 800 may start by step 810 of positioning an object on a chuck that is positioned within the chamber. The chuck is mechanically coupled to a movement system.

Step 810 may be followed by step 820 of sealing the chamber from the movement system by forming, by at least one sealing element, a dynamic seal between an intermediate element and the chamber housing. The intermediate element is positioned between the chamber housing and the movement system.

Step 810 may also be followed by repeating, for each region of the object out of a plurality of regions of the object, steps 830 and 840.

Step 830 may include rotating the chuck, by the movement system, to position a given portion of the region of the object within a field of view that is related to an opening of the chamber housing.

The field of view is related to the opening in the sense that (a) an evaluation tool that has a field of view may be partially inserted through the opening, and/or (b) an evaluation tool that has a field of view may view the object through the opening.

Step 830 may include using a rotary stage of the movement system to rotate the chuck.

Step 830 may be followed by step 840 of moving the chuck, by the movement system, in relation to the opening to position additional portions of the region of the object within the field of view that is related to the opening.

Step 830 and 840 may be executed in parallel to step 820.

The object may have a radial symmetry and the plurality of regions may include four regions—or any other number of regions.

Step 840 may include at least one of the following:
a. Using an XY (X-axis and Y-axis) stage of the movement system.
b. Moving the intermediate element in relation to the chamber housing while moving the chuck in relation to the opening.
c. Moving the intermediate element by up to a maximal distance in any direction, wherein the maximal distance does not exceed one hundred and twenty percent of a radius of the object.

Figure 18:
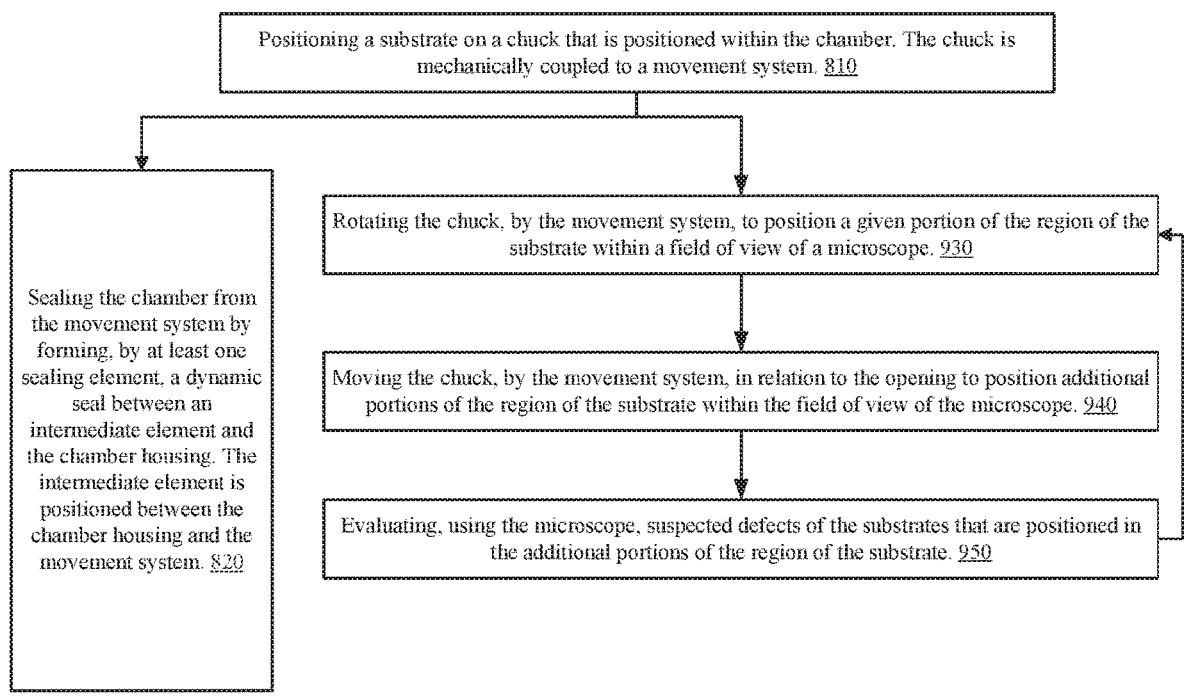
FIG. 18 is an example of a method.

FIG. 18 is an example of method 900 for moving an object within a chamber that includes a chamber housing.

Method 900 may start by step 810 of positioning an object on a chuck that is positioned within the chamber. The chuck is mechanically coupled to a movement system.

Step 810 may be followed by step 820 of sealing the chamber from the movement system by forming, by at least one sealing element, a dynamic seal between an intermediate element and the chamber housing. The intermediate element is positioned between the chamber housing and the movement system.

Step 810 may also be followed by repeating, for each region of the object out of a plurality of regions of the object, steps 930, 940 and 950.

Step 930 may include rotating the chuck, by the movement system, to position a given portion of the region of the object within a field of view of a microscope.

Step 930 may be followed by step 940 of moving the chuck, by the movement system, in relation to the opening to position additional portions of the region of the object within the field of view of the microscope.

Step 940 may be followed by step 950 of evaluating, using the microscope, suspected defects of the objects that are positioned in the additional portions of the region of the object.

The microscope may be a scanning electron microscope.

Step 950 may include finding the suspected defects using an optical microscope and scanning the suspected defects by the scanning electron microscope.

The evaluation unit is compact and can be integrated with various tools that differ from any of the systems illustrated in any of the previous Figures.

The evaluation unit may include a review tool such as a scanning electron microscope reviews defects of an object positioned within the chamber. The evaluation unit may be included in an optical inspection system.

The evaluation tool may be configured to perform immediate, object to object comparison and accurate control of a processing of the object. The object may be, for example, a mask or a wafer. The processing of the object may include, for example, at least one out of etch, deposition, copper mechanical polishing, and Implant.

The scanning electron microscope may be configured to perform at least one of the following tasks: detect defect, review defects, measure dimensions, measure layer to layer location, measure pattern positioning and edge placement accuracy.

The scanning electron microscope, after completing a task may be configured to provide immediate feedback to a processing tool.

Any of the systems may be integrated with one or more processing tool. For example—one or more of the evaluation units of the system may be replaced by a processing tool. Accordingly—the processing tool and the evaluation tool may belong to the same system. Hence immediate and automated tuning of the processing tool may be provided.

The integration of the evaluation tool with a process tool allows to perform evaluations of layers or features of an object during manufacturing steps that limit the provision of the object outside of the process environment defined by the processing tool. The limit may result, for example, due to oxidation.

The inclusion of a processing tool in a system that includes one or more evaluation units may provide (a) fast fault response and root cause analysis, (b) improve process quality and process uniformity along the object, (c) improve process chamber to process chamber matching.

Most of the wafer fabrication systems include multiple process chambers which perform the same operations. (same chemistry, thermal effects, material flows, irradiances and the like). However, there are small differences among the exact process parameters of the process chambers. The differences will cause fabrication process differences and the final result will be physical differences among wafers due to their history location in the specific process chamber. The evaluation tool will enable to define the differences and to perform immediate parameters tuning which will bring the process chambers to match to other and hence to reduce the process differences associated with the differences among process chambers.

The evaluation unit facilitates non-destructive inspection, metrology, compositional analysis of moisture, atmosphere and time sensitivity nanofilms and structures.

In the foregoing specification, the embodiments of the disclosure has been described with reference to specific examples of embodiments of the disclosure. It will, however, be evident that various modifications and changes may be made therein without departing from the broader spirit and scope of the embodiments of the disclosure as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of step in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described steps are merely illustrative. The multiple may be combined into a single step, a single step may be distributed in additional steps and steps may be executed at least partially overlapping in time. Moreover, alternative embodiments may include multiple instances of a particular step, and the order of steps may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to embodiments of the disclosures containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the embodiments of the disclosure have been illustrated and described herein, many modifications, substitutions, changes, and equivalents will now occur to those of ordinary skill in the art. It is, therefore, to be understood that the appended claims are intended to cover all such modifications and changes as fall within the true spirit of the embodiments of the disclosure.

What is claimed is:

1. A system for evaluation of objects, the system comprising:
    evaluation units;
    an object distribution system that is configured to receive the objects and distribute the objects between the evaluation units;
    at least one controller that is configured to control the evaluation units and the object distribution system;
    wherein each evaluation unit of the evaluation units comprises:
        a chamber housing that has an inner space;
        a chuck that is configured to support an object while the object is positioned within the inner space;
        a movement system that is configured to move the chuck;
        an intermediate element positioned between the chamber housing and the movement system;
        at least one sealing element configured to form a dynamic seal between the intermediate element and the chamber housing, wherein the dynamic seal is configured to seal the inner space from the movement system;
        a charged particle module that is configured to irradiate the object with a charged particle beam, and to detect particles emitted from the object; and
    wherein for each evaluation unit of the evaluation units, a length of the inner space is smaller than twice a length of the object, and a width of the inner space is smaller than twice a width of the object; and
    wherein the movement system is configured to perform, for each region of the object out of a plurality of regions of the object, (a) a rotation of the chuck to position a given portion of the region of the object within a field of view of the charged particle module; and (b) a movement of the chuck in relation to the charged particle module to position additional portions of the region of the object within the field of view of the charged particle module.

2. The system according to claim 1 wherein for each evaluation unit of the evaluation units:
the length of the inner space is smaller than twice the length of the object and exceeds 1.5 times of the length of the object; and
the width of the inner space is smaller than twice the width of the object and exceeds 1.5 times of the width of the object.

3. The system according to claim 1 wherein the evaluation units are configured to evaluate the objects in parallel.

4. A system for evaluation of objects, the system comprising:
evaluation units;
an object distribution system that is configured to receive the objects and distribute the objects between the evaluation units;
vibration dumping elements that are coupled between the evaluation units and the object distribution system;
at least one controller that is configured to control the evaluation units and the object distribution system;
wherein each evaluation unit of the evaluation units comprises:
a chamber housing that has an inner space;
a chuck that is configured to support an object while the object is positioned within the inner space;
a movement system that is configured to move the chuck;
a charged particle module that is configured to irradiate the object with a charged particle beam, and to detect particles emitted from the object; and
wherein for each evaluation unit of the evaluation units, a length of the inner space is smaller than twice a length of the object, and a width of the inner space is smaller than twice a width of the object.

5. The system according to claim 4 wherein the vibration dumping elements are bellows.

6. A method for evaluating objects, the method comprising:
receiving objects by an object distribution system;
distributing the objects, by the object distribution system, between evaluation units; and
evaluating the objects by the evaluation units;
wherein the evaluating of the objects by the evaluation units comprises evaluating at least two objects by at least two evaluation units in parallel;
wherein an evaluating of an object of the objects by an evaluation unit of the evaluation units comprises:
positioning the object on a chuck of the evaluation unit and within an inner space that is defined by a chamber housing of the evaluation unit;
sealing the inner space from a movement system of the evaluation unit;
irradiating, by a charged particle module of the evaluation unit, the object with a charged particle beam;
detecting, by the charged particle module, particles emitted from the object; and
repeating, for each region of the object out of a plurality of regions of the object, the steps of:
rotating the chuck, by the movement system, to position a given portion of the region of the object within a field of view of the charged particle module; and
moving the chuck, by the movement system, in relation to the charged particle module to position additional portions of the region of the object within the field of view of the charged particle module;
wherein for each evaluation unit of the evaluation units, a length of the inner space is smaller than twice a length of the object and a width of the inner space is smaller than twice a width of the object.

7. The method according to claim 6 wherein for each evaluation unit of the evaluation units the length of the inner space is smaller than twice the length of the object and exceeds 1.5 times of the length of the object, and the width of the inner space is smaller than twice the width of the object and exceeds 1.5 times of the width of the object.

8. The method according to claim 6 wherein the object has a radial symmetry and wherein the plurality of regions comprise four regions.

9. The method according to claim 6 comprising performing a calibration process of the evaluation units by comparing between evaluation results generated by different evaluation units in regard to a same object.

10. A method for evaluating objects, the method comprising:
receiving objects by an object distribution system;
distributing the objects, by the object distribution system, between evaluation units; and
dumping vibrations by vibration dumping elements that are coupled between the evaluation units and the object distribution system;
evaluating the objects by the evaluation units;
wherein the evaluating of the objects by the evaluation units comprises evaluating at least two objects by at least two evaluation units in parallel;
wherein an evaluating of an object of the objects by an evaluation unit of the evaluation units comprises:
positioning the object on a chuck of the evaluation unit and within an inner space that is defined by a chamber housing of the evaluation unit;
sealing the inner space from a movement system of the evaluation unit;
irradiating, by a charged particle module of the evaluation unit, the object with a charged particle beam; and
detecting, by the charged particle module, particles emitted from the object;
wherein for each evaluation unit of the evaluation units, a length of the inner space is smaller than twice a length of the object and a width of the inner space is smaller than twice a width of the object.

11. The method according to claim 10 wherein the vibration dumping elements are bellows.

* * * * *